(12) United States Patent
Ozeki

(10) Patent No.: US 11,635,663 B2
(45) Date of Patent: Apr. 25, 2023

(54) DISPLAY DEVICE AND TRANSISTOR

(71) Applicant: Japan Display Inc., Tokyo (JP)

(72) Inventor: Yoshitaka Ozeki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/390,328

(22) Filed: Jul. 30, 2021

(65) Prior Publication Data

US 2021/0356786 A1 Nov. 18, 2021

Related U.S. Application Data

(63) Continuation-in-part of application No. PCT/JP2019/044308, filed on Nov. 5, 2019.

(30) Foreign Application Priority Data

Jan. 31, 2019 (JP) .............................. JP2019-015774

(51) Int. Cl.
G02F 1/1368 (2006.01)
G02F 1/1362 (2006.01)
G02F 1/167 (2019.01)
H01L 29/417 (2006.01)
H01L 29/423 (2006.01)

(52) U.S. Cl.
CPC ...... G02F 1/1368 (2013.01); G02F 1/136286 (2013.01); G02F 1/167 (2013.01); H01L 29/41733 (2013.01); H01L 29/42384 (2013.01)

(58) Field of Classification Search
CPC .. G02F 1/1368; G02F 1/136286; G02F 1/167; H01L 29/41733; H01L 29/42384

USPC ......................................................... 349/46
See application file for complete search history.

(56) References Cited

U.S. PATENT DOCUMENTS 6,144,082 A 11/2000 Yamazaki et al.
6,512,504 B1 * 1/2003 Yamauchi ........... H01L 27/1255
257/E27.111
2002/0056875 A1 5/2002 Hayashi
(Continued)

FOREIGN PATENT DOCUMENTS

JP H11186561 A 7/1999
JP 2000036599 A 2/2000
(Continued)

OTHER PUBLICATIONS

International Search Report dated Dec. 24, 2019 in Application No. PCT/JP2019/043308.
(Continued)

Primary Examiner — Charles S Chang
(74) Attorney, Agent, or Firm — K&L Gates LLP

(57) ABSTRACT

According to one embodiment, a display device includes a display panel and a drive circuit. A transistor provided in a pixel portion or a peripheral portion of the display panel includes a semiconductor layer having a first end and a second end, first and second gate electrodes overlapping the semiconductor layer, a source electrode connected to the first end, and a drain electrode connected to the second end. The first and second gate electrodes are disposed in a first layer. The source electrode and the drain electrode are disposed in a second layer. The source electrode is formed to cover at least a first channel region in planar view. The drain electrode is formed to cover at least a second channel region in planar view.

18 Claims, 12 Drawing Sheets

(56) References Cited

U.S. PATENT DOCUMENTS

| | | | |
|---|---|---|---|
| 2002/0070382 A1 | 6/2002 | Yamazaki et al. | |
| 2003/0122121 A1 | 7/2003 | Yamazaki et al. | |
| 2004/0075094 A1 | 4/2004 | Yamazaki et al. | |
| 2007/0284627 A1* | 12/2007 | Kimura | G02F 1/134363 |
| | | | 257/257 |
| 2009/0045408 A1 | 2/2009 | Sakai et al. | |
| 2011/0037917 A1* | 2/2011 | Kimura | G09G 3/342 |
| | | | 349/46 |
| 2012/0061666 A1* | 3/2012 | Inoue | H01L 27/1251 |
| | | | 257/43 |
| 2017/0108723 A1* | 4/2017 | No | G02F 1/133514 |
| 2017/0270878 A1 | 9/2017 | Moriyama | |

FOREIGN PATENT DOCUMENTS

| | | |
|---|---|---|
| JP | 2002189427 A | 7/2002 |
| JP | 2003308027 A | 10/2003 |
| JP | 2009-049080 | 3/2009 |
| JP | 2017-167432 | 9/2017 |

OTHER PUBLICATIONS

Japanese Office Action dated Sep. 6, 2022 in corresponding Japanese Application No. 2019-015774.

* cited by examiner

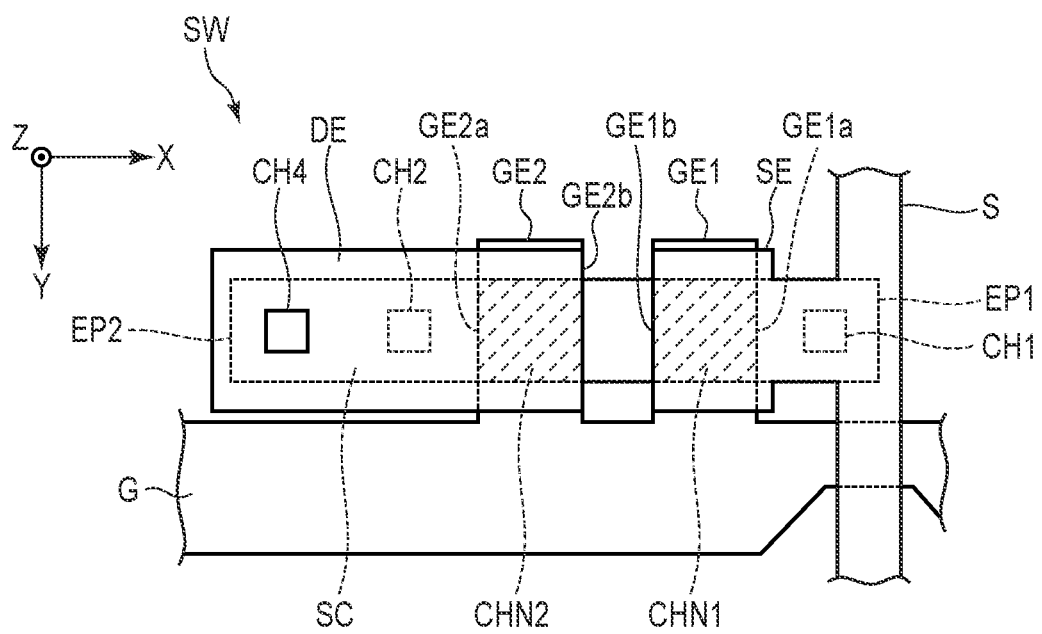
F I G. 3

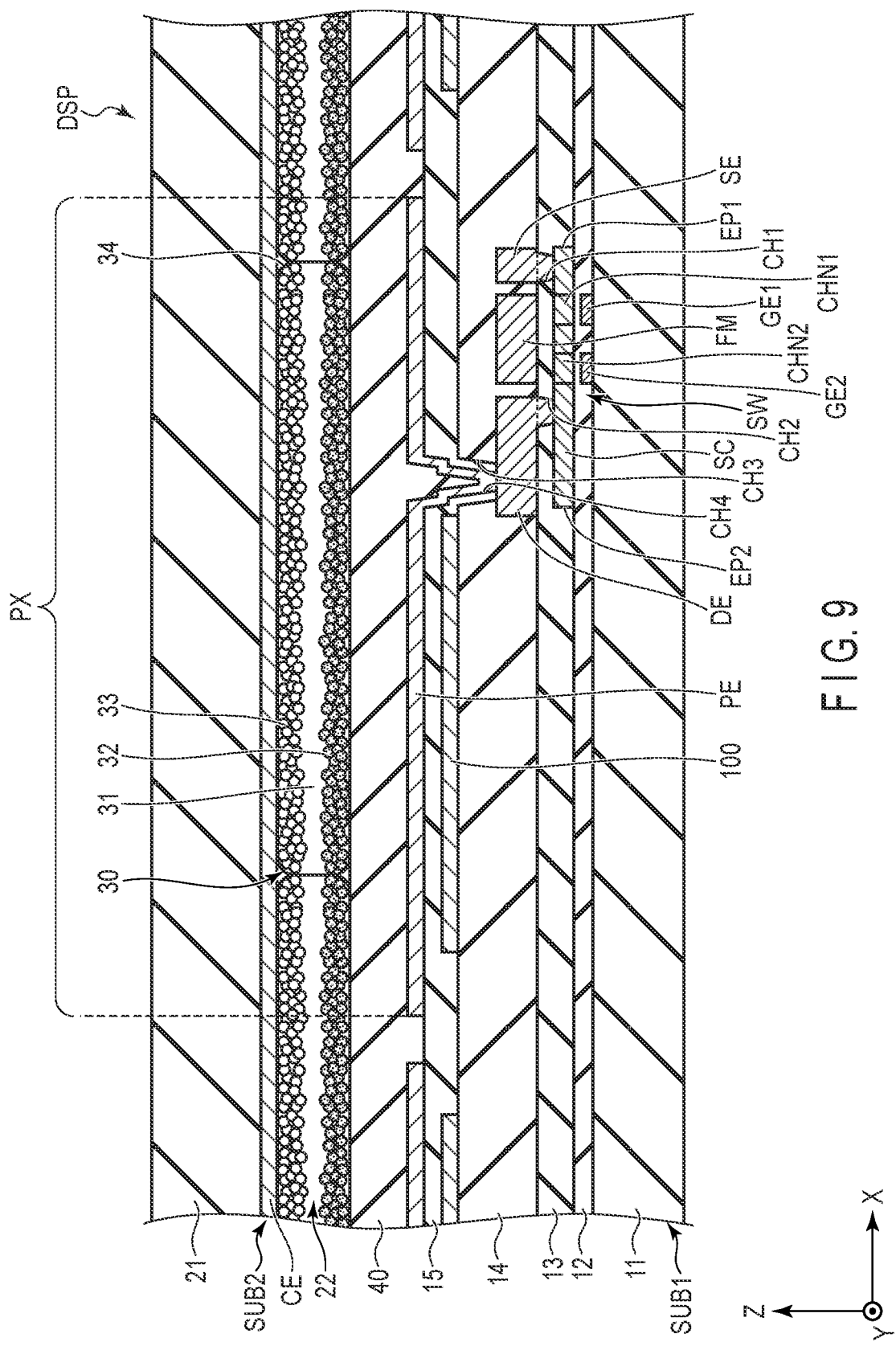
F I G. 9

DISPLAY DEVICE AND TRANSISTOR

CROSS-REFERENCE TO RELATED APPLICATIONS

This application is a Continuation-in-part Application of PCT Application No. PCT/JP2019/043308, filed Nov. 5, 2019 and based upon and claiming the benefit of priority from Japanese Patent Application No. 2019-015774, filed Jan. 31, 2019, the entire contents of all of which are incorporated herein by reference.

FIELD

Embodiments described herein relate generally to a display device and a transistor.

BACKGROUND

In general, an electrophoretic display (EPD) device in which an electrophoretic element is sandwiched between an element substrate and a counter substrate is known.

According to the EPD device, for example, white or black can be displayed in each pixel by driving a pixel transistor included in each pixel arranged in the EPD device.

Meanwhile, the EPD device has large drive voltage, and high voltage is also applied to the above pixel transistor.

Therefore, in the EPD device, characteristic abnormality or operation abnormality may occur because of heat generation caused by the high voltage applied to the pixel transistor.

SUMMARY

The present application generally relates to a display device and a transistor.

According to one embodiment, a display device includes a display panel and a drive circuit. A transistor provided in a pixel portion or a peripheral portion of the display panel includes a semiconductor layer having a first end and a second end, first and second gate electrodes overlapping the semiconductor layer, a source electrode connected to the first end, and a drain electrode connected to the second end. The first and second gate electrodes are disposed in a first layer. The source electrode and the drain electrode are disposed in a second layer. The source electrode is formed to cover at least a first channel region in planar view. The drain electrode is formed to cover at least a second channel region in planar view.

BRIEF DESCRIPTION OF THE DRAWINGS

FIG. 3 is a plan view illustrating an example of a pixel transistor.

FIG. 9 is a diagram illustrating an example of a cross section of a pixel along a first direction according to a second embodiment.

DETAILED DESCRIPTION

In general, according to one embodiment, a display device includes a display panel and a drive circuit. The display panel includes a pixel portion where a plurality of pixels is disposed and a peripheral portion provided around the pixel portion. The drive circuit is provided in the peripheral portion and is configured to drive the pixel. A transistor is provided in the pixel portion or the peripheral portion. The transistor includes a semiconductor layer having a first end and a second end, a first gate electrode overlapping the semiconductor layer at a position closer to the first end, a second gate electrode overlapping the semiconductor layer between the first gate electrode and the second end, a source electrode connected to the first end, and a drain electrode connected to the second end. The first and second gate electrodes are disposed in a first layer. The source electrode and the drain electrode are disposed in a second layer different from the first layer. The source electrode is formed to cover at least a first channel region that is an overlapping region of the first gate electrode and the semiconductor layer in planar view. The drain electrode is formed to cover at least a second channel region that is an overlapping region of the second gate electrode and the semiconductor layer in planar view.

Various embodiments will be explained hereinafter with reference to the accompanying drawings. Note that the disclosure is merely an example, and any embodiment which is conceivable by a person having an ordinary skill in the art within the spirit of the invention is encompassed by a range of the present invention. Furthermore, for better understanding of the explanation, figures may be drawn more schematically as compared to an actual embodiment, and they are merely for clarification. Such schematic illustration does not limit the interpretation of the present invention. In each figure, some of same or similar elements arranged continuously may not be denoted, and the reference numbers may be omitted. Furthermore, in the description and each figure, structural elements which are functionally the same or similar to those have been explained already will be referred to by the same reference numbers and the explanation considered to be redundant will be omitted.

First Embodiment

Figure 1:
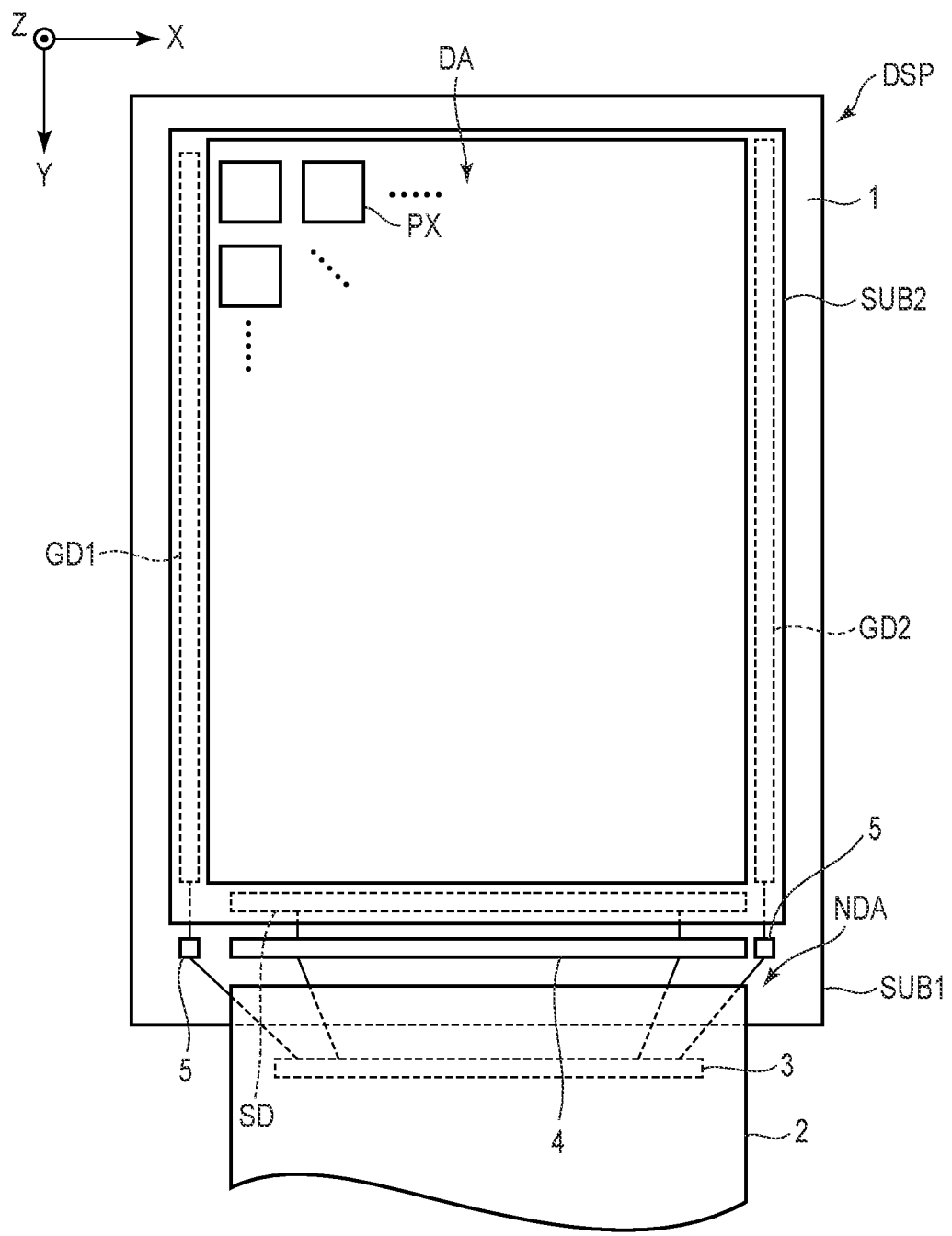
FIG. 1 is a plan view illustrating an example of a configuration of a display device according to a first embodiment.

FIG. 1 is a plan view illustrating an example of a configuration of a display device according to a first embodiment. In the example illustrated in FIG. 1, a first direction X, a second direction Y, and a third direction Z are orthogonal to each other, but may intersect each other at an angle other than 90 degrees. The first direction X and the second direction Y correspond to a direction parallel to the main surface of a substrate constituting a display device DSP, and the third direction Z corresponds to a thickness direction of the display device DSP. In the present embodiment, the position on the front end side of the arrow indicating the third direction Z is referred to as upward (or simply top), and the position on the rear end side of the arrow is referred to as downward (or simply bottom). In addition, it is assumed that there is an observation position where the display device DSP is observed on the front end side of the arrow indicating the third direction Z, and viewing from this observation position toward an X-Y plane defined by the first direction X and the second direction Y is referred to as planar view.

The display device DSP illustrated in FIG. 1 includes a display panel 1 having a first substrate SUB1 and a second substrate SUB2. The display panel 1 includes a display area DA as a pixel portion and a non-display area NDA as a peripheral portion provided around the pixel portion.

The display area DA is located in an area where the first substrate SUB1 and the second substrate SUB2 overlap in planar view. In the display area DA (pixel portion), a plurality of pixels PX is disposed in a matrix in the first direction X and the second direction Y.

The non-display area NDA is formed in a frame shape. A drive circuit (a drive circuit that drives the display panel 1) including gate drivers GD1 and GD2 and a source driver SD is located in the non-display area NDA and provided on the first substrate SUB1.

A flexible wiring substrate 2 is connected to the first substrate SUB1. An IC chip 3 is connected to the flexible wiring substrate 2. Note that the IC chip 3 may be connected to the first substrate SUB1. In addition, the above gate drivers GD1 and GD2 and the source driver SD may be built in the IC chip 3 for example.

Furthermore, in the display device DSP according to the present embodiment, protection diodes 4 and 5 may be provided on the first substrate SUB1. The protection diode 4 is disposed between the flexible wiring substrate 2 and the source driver SD, and a signal supplied through the protection diode 4 is input to the source driver SD. The protection diode 5 is disposed at a position corresponding to each of the gate drivers GD1 and GD2, and a signal supplied through the protection diode 5 is input to the gate drivers GD1 and GD2.

Figure 2:
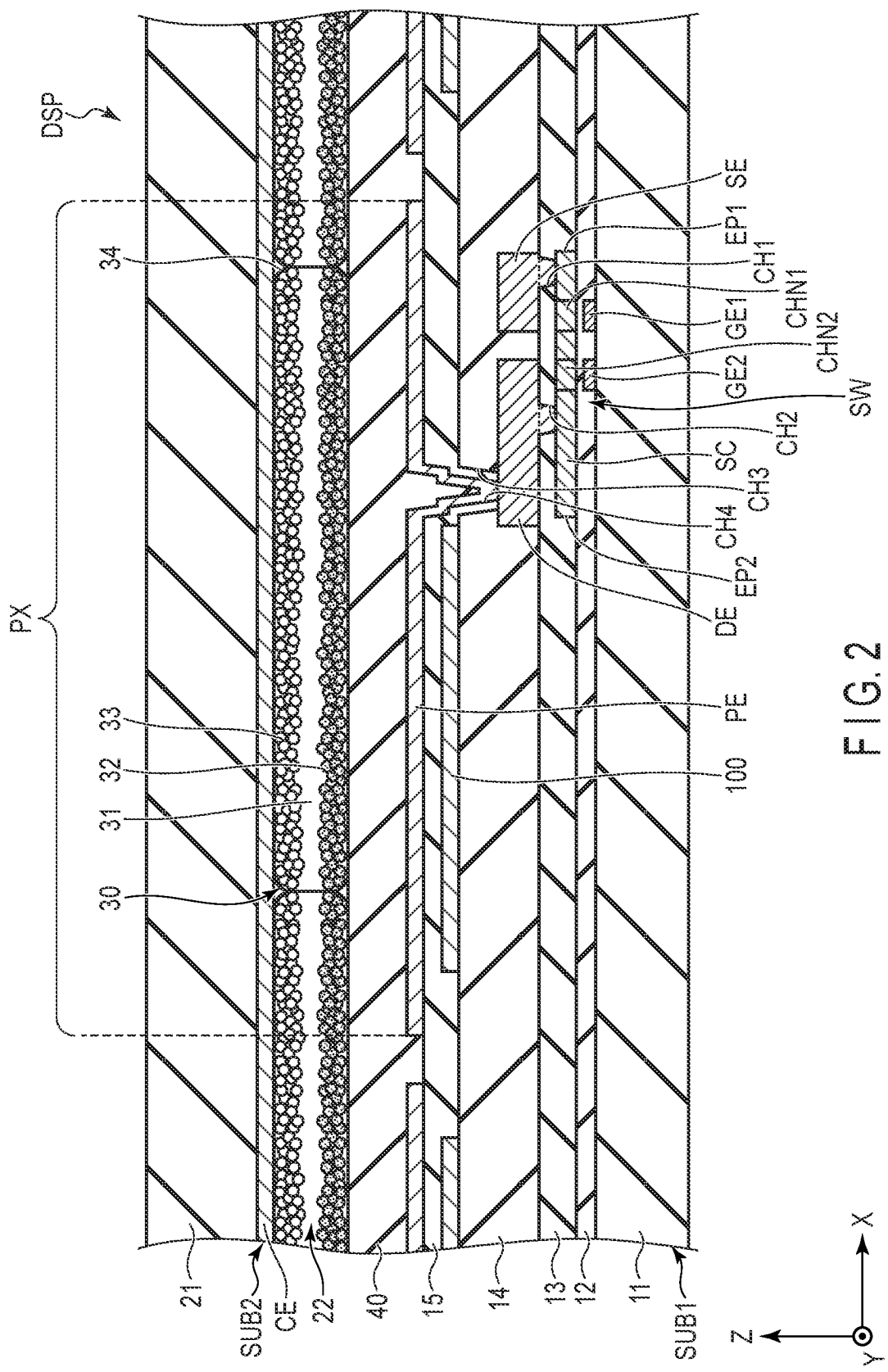
FIG. 2 is a diagram illustrating an example of a cross section of a pixel along a first direction.

FIG. 2 illustrates an example of a cross section of the pixel PX along the first direction X provided in the pixel portion. As illustrated in FIG. 2, the first substrate SUB1 includes a base material 11 and insulating films 12 to 15.

The base material 11 is an insulating substrate formed of insulating glass or resin such as polyimide resin. Since the base material 11 is located on the opposite side of the observation position with respect to the second substrate SUB2, the base material 11 is, for example, an opaque base material, but may be a transparent base material.

Here, the above pixel PX (pixel circuit) includes a pixel transistor (thin film transistor) SW that is a switching element, but in the present embodiment, the pixel transistor SW has a double gate structure. That is, the pixel transistor SW includes a semiconductor layer SC, two gate electrodes GE1 and GE2, one source electrode SE, and one drain electrode DE.

The gate electrodes GE1 and GE2 are located on the base material 11 and covered with the insulating film (gate insulating film) 12. The gate electrodes GE1 and GE2 are formed of metal materials such as aluminum (Al), titanium (Ti), silver (Ag), molybdenum (Mo), tungsten (W), copper (Cu), and chromium (Cr), and alloy obtained by combining these metal materials, and the like. The gate electrodes GE1 and GE2 may have a single layer structure or a laminated structure.

The semiconductor layer SC is located on the insulating film 12 and covered with the insulating film 13. The semiconductor layer SC is disposed at a position overlapping the above gate electrodes GE1 and GE2 in planar view. The semiconductor layer SC is formed of, for example, polycrystalline silicon (for example, low-temperature polysilicon), but may be formed of amorphous silicon or an oxide semiconductor.

Note that, in the example illustrated in FIG. 2, the pixel transistor SW is a bottom gate type transistor in which the gate electrodes GE1 and GE2 are disposed between the base material 11 and the semiconductor layer SC (that is, under the semiconductor layer SC).

The source electrode SE and the drain electrode DE are located on the insulating film 13 and covered with the insulating film 14. The source electrode SE and the drain electrode DE are formed of the same materials, and are formed using, for example, the above metal materials. The source electrode SE is in contact with (connected to) the semiconductor layer SC in a through hole CH1 penetrating the insulating film 13. The drain electrode DE is in contact with (connected to) the semiconductor layer SC in a through hole CH2 penetrating the insulating film 13.

That is, the transistor SW includes the semiconductor layer SC, the gate electrode GE1 overlapping the semiconductor layer SC at a position closer to one end (first end) EP1 of the semiconductor layer SC, the gate electrode GE2 overlapping the semiconductor layer SC between the gate electrode GE1 and the other end (second end) EP2, the source electrode SE connected to the end EP1 of the semiconductor layer SC, and the drain electrode DE connected to the end EP2 of the semiconductor layer SC.

Although the gate electrodes GE1 and GE2 are connected to the scanning line and the source electrode SE is connected to the signal line, the scanning line and the signal line are omitted in FIG. 2.

A capacitance electrode 100 is located on the insulating film 14 and covered with the insulating film (capacitance insulating film) 15. The capacitance electrode 100 is a transparent electrode formed of a transparent conductive material such as indium tin oxide (ITO) or indium zinc oxide (IZO). The capacitance electrode 100 may be formed of a non-transparent metal material (non-transparent conductive material). Although omitted in FIG. 2, the capacitance electrode 100 may be in contact with, for example, a feed line.

A pixel electrode PE is located on the insulating film 15. One pixel electrode PE is provided for each of the plurality of pixels PX disposed in the display area DA.

The pixel electrode PE is in contact with the drain electrode DE in a through hole CH3 penetrating the insulating film 14 and a through hole CH4 penetrating the insulating film 15. The pixel electrode PE is a transparent electrode formed of a transparent conductive material such as ITO or IZO described above. The pixel electrode PE may be formed of a metal material (non-transparent conductive material) having light reflectivity. The pixel electrode PE overlaps the capacitance electrode 100 via the insulating film 15, and forms the capacitance of the pixel PX.

The insulating films 12, 13, and 15 correspond to inorganic insulating films formed of an inorganic material such as silicon oxide (SiO), silicon nitride (SiN), or silicon oxynitride (SiON). The insulating films 12, 13, and 15 may have a single layer structure or a laminated structure.

The insulating film 14 corresponds to an organic insulating film (organic planarization film) formed of an organic material such as acrylic resin. The insulating film 14 is formed to be thicker than the above inorganic insulating film (insulating films 12, 13 and 15). By forming the organic insulating film with a predetermined thickness, irregularities below the organic insulating film are absorbed, and the organic insulating film becomes flat. As a result, irregularities of the capacitance electrode and the pixel electrode formed on the organic insulating film are reduced.

Here, the display device DSP according to the present embodiment is, for example, an electrophoretic display (EPD) device. In this case, the second substrate SUB2 includes a base material 21, a common electrode CE, and electrophoretic element 22.

The base material 21 is formed of insulating glass or resin such as polyimide resin. The base material 21 is a transparent base material because it is located on the observation position side with respect to the first substrate SUB1.

The common electrode CE is located between the base material 21 and the electrophoretic element 22. The common electrode CE is a transparent electrode formed of a transparent conductive material such as ITO or IZO. The common electrode CE has the same potential as the above capacitance electrode 100.

The electrophoretic element 22 is located between the pixel electrode PE and the common electrode CE. The electrophoretic element 22 is formed of a plurality of microcapsules 30 arranged with almost no gap in the X-Y plane.

The microcapsules 30 have a particle size of, for example, about 20 μm to 70 μm. For example, about 1 to 10 microcapsules 30 are disposed on the rectangular or polygonal pixel electrode PE having a side length of about hundred to several hundred μm.

The microcapsules 30 includes a dispersion medium 31, a plurality of black particles 32, and a plurality of white particles 33. An outer shell 34 of the microcapsule 30 is formed of a transparent resin such as acrylic resin.

The dispersion medium 31 is a liquid that disperses the black particles 32 and the white particles 33 in the microcapsule 30.

The black particles 32 and the white particles 33 are referred to as, for example, electrophoretic particles, and have charges of the polarity opposite to each other. For example, the black particles 32 are positively charged, and the white particles 33 are negatively charged.

In addition to the black particles 32 and the white particles 33, the microcapsule 30 may include electrophoretic particles of other colors such as red, green, blue, yellow, cyan, and magenta. In addition, the electrophoretic particles of the above other colors may replace at least one of the black particles 32 and the white particles 33.

When the pixel PX displays black in the electrophoretic element 22 having the above configuration, the pixel electrode PE is held at a relatively higher potential than the common electrode CE. That is, when the potential of the common electrode CE is set as the reference potential, the pixel electrode PE is held in the positive polarity. Thus, the positively charged black particles 32 are attracted to the common electrode CE, while the negatively charged white particles 33 are attracted to the pixel electrode PE. As a result, when the pixel PX is observed from above the second substrate SUB2 (that is, the observation position), black is visually recognized.

On the other hand, when the pixel PX displays white, the pixel electrode PE is held at a relatively lower potential than the common electrode CE. That is, when the potential of the common electrode CE is set as the reference potential, the pixel electrode PE is held in the negative polarity. Thus, the negatively charged white particles 33 are attracted to the common electrode CE side, while the positively charged black particles 32 are attracted to the pixel electrode PE. As a result, when the pixel PX is observed from above the second substrate SUB2 (that is, the observation position), white is visually recognized.

The first substrate SUB1 and the second substrate SUB2 are bonded by an adhesive layer 40. In the example illustrated in FIG. 2, the adhesive layer 40 is located between the pixel electrode PE and the electrophoretic element 22.

FIG. 3 is a plan view illustrating an example of the pixel transistor SW according to the present embodiment. Note that, as described above, the pixel transistor SW has a double gate structure including two gate electrodes (that is, the gate electrodes GE1 and GE2).

As illustrated in FIG. 3, the gate electrodes GE1 and GE2 are formed in the same layer as a scanning line G, and are connected to the scanning line G. The scanning line G extends along the first direction X and is connected to one of the gate drivers GD1 and GD2 illustrated in FIG. 1. The source electrode SE is connected to a signal line S formed in the same layer as the source electrode SE and the drain electrode DE. The signal line S extends along the second direction Y and is connected to the source driver SD illustrated in FIG. 1. The pixel transistor SW is located at an intersection between the scanning line G and the signal line S.

The gate electrodes GE1 and GE2 are disposed side by side at intervals in the first direction X. In addition, the gate electrodes GE1 and GE2 are disposed at positions overlapping the semiconductor layer SC.

The gate electrodes GE1 and GE2 are formed in the same shape and the same size (area) in planar view.

The source electrode SE is electrically connected to the semiconductor layer SC in the through hole CH1. The drain electrode DE is electrically connected to the semiconductor layer SC in the through hole CH2. The pixel electrode PE is electrically connected to the drain electrode DE in the through hole CH4. In this case, the drain electrode DE also functions as a pedestal of the contact portion that is in contact with the pixel electrode PE.

Here, the gate electrode GE1 includes a first end GE1a along the signal line S and a second end GE1b provided between the first end GE1a and the gate electrode GE2. With respect to the gate electrode GE1, the source electrode SE extends along a gate line G, and overlaps both the first end GE1a and the second end GE1b in planar view.

In addition, the gate electrode GE2 includes a third end GE2a along the direction intersecting (for example, going straight) with the gate line G, and a fourth end GE2b provided between the third end GE2a and the gate electrode GE1. With respect to the gate electrode GE2, the drain electrode DE extends along the gate line G, and overlaps both the third end GE2a and the fourth end GE2b in planar view.

That is, in the present embodiment, the source electrode SE is formed to entirely cover the gate electrode GE1 (the upper portion of the channel region corresponding to the gate electrode GE1) in the first direction X, and the drain electrode DE is formed to entirely cover the gate electrode GE2 (the upper portion of the channel region corresponding to the gate electrode GE2). The channel region refers to a region CHN1 overlapping the gate electrode GE1 by orthographic projection of the gate electrode GE1 and a region CHN2 overlapping the gate electrode GE2 by orthographic projection of the gate electrode GE2 in the semiconductor layer. In the example illustrated in FIG. 3, the end of the source electrode SE on the side of the drain electrode DE coincides with the end GE1b of the gate electrode GE1 in planar view, but the source electrode SE may cover the entire gate electrode GE1 in the first direction X. Therefore, the end of the source electrode SE on the drain electrode DE side may further extend beyond the end GE1b of the gate electrode GE1 on the gate electrode GE2 side.

Similarly, the end of the drain electrode DE on the source electrode SE side may further extend beyond the end GE2b of the gate electrode GE2.

Figure 4:
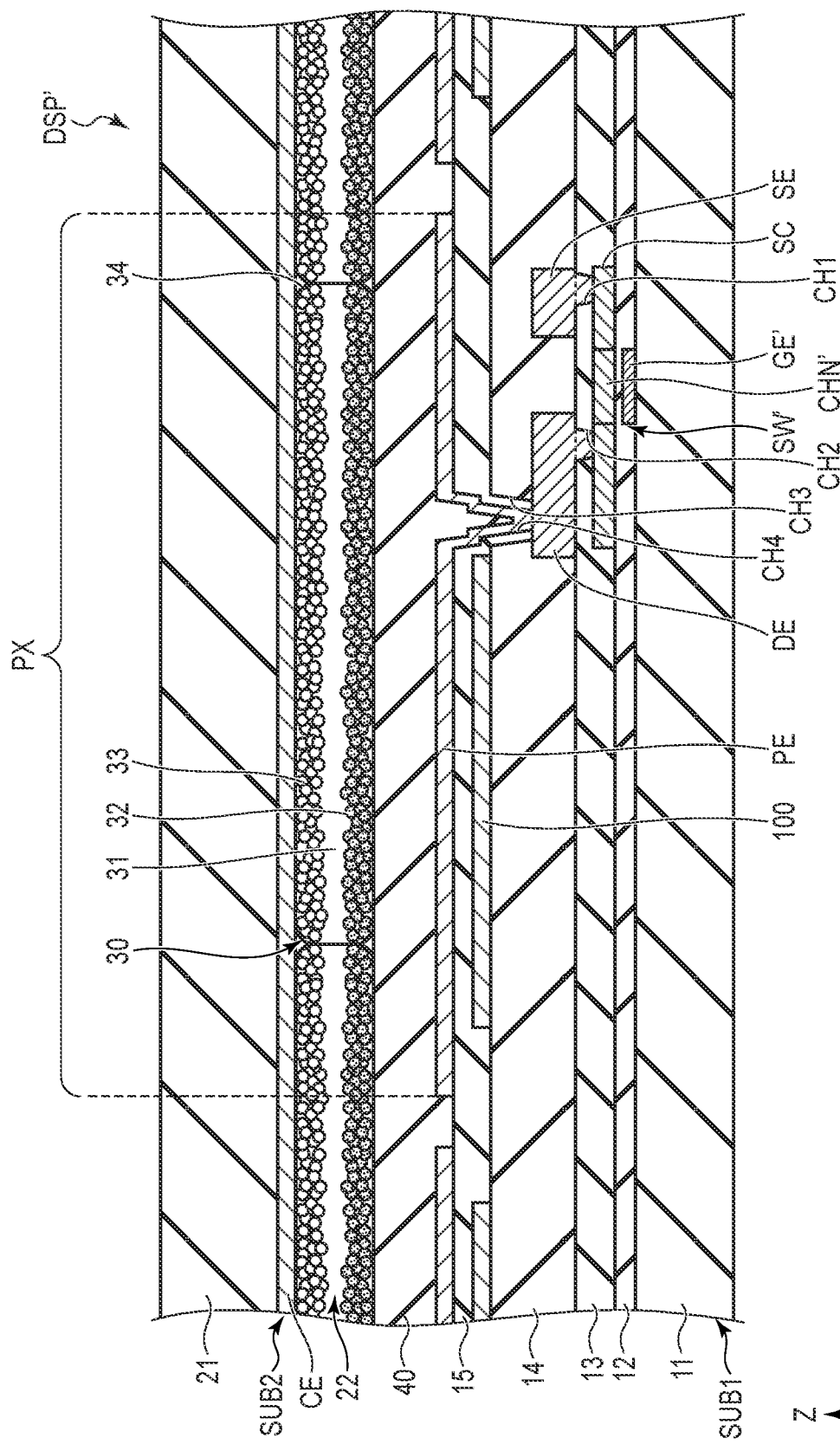
FIG. 4 is a diagram illustrating an example of a cross section of the pixel along the first direction in a comparative example of the present embodiment.

Hereinafter, the operation of the display device DSP according to the present embodiment will be described. Here, FIG. 4 is a diagram illustrating a cross section of the pixel PX along the first direction X in a comparative example of the present embodiment. Furthermore, FIG. 5 is a plan view of a pixel transistor SW' in a comparative example of the present embodiment.

Figure 5:
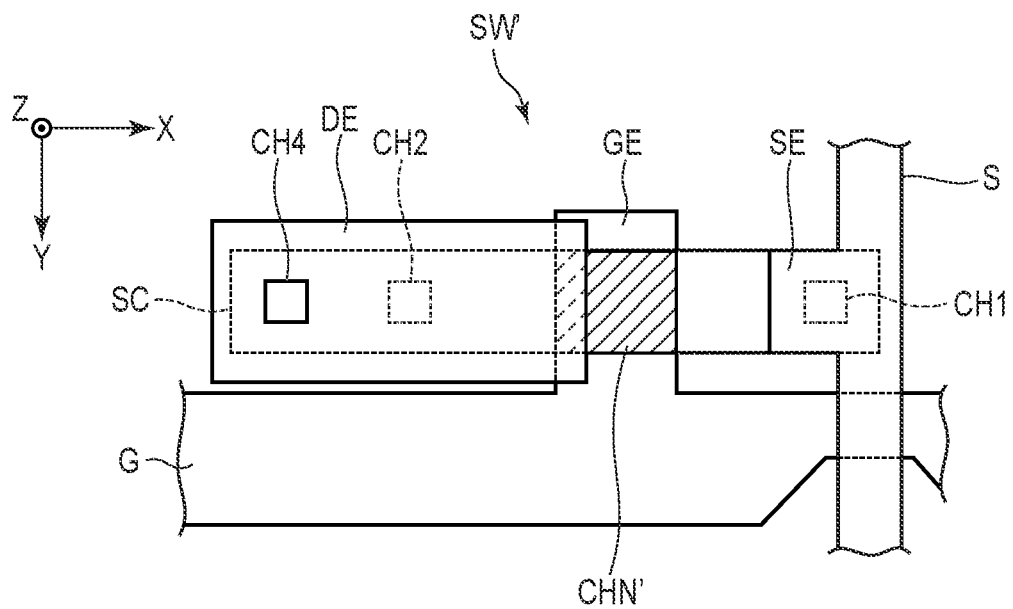
FIG. 5 is a plan view illustrating an example of the pixel transistor in a comparative example of the present embodiment.

In FIGS. 4 and 5, the same reference numerals and characters as FIGS. 2 and 3 are given to the parts that are similar to those in FIGS. 2 and 3. Here, description of the parts that are similar to those in FIGS. 2 and 3 will be omitted. The same applies to the following description. In the comparative example of the present embodiment, the pixel transistor SW' has a single gate structure. That is, the pixel transistor SW' includes one gate electrode GE', one source electrode SE, and one drain electrode DE.

In addition, in the comparative example of the present embodiment, it is assumed that the source electrode SE does not overlap the gate electrode GE' in planar view. In addition, it is assumed that the drain electrode DE overlaps just a part of the gate electrode GE' on the drain electrode DE side in planar view.

That is, the comparative example of the present embodiment is different from the present embodiment in that the pixel transistor SW' has a single gate structure and the gate electrode GE' is not entirely covered with the source electrode SE and the drain electrode DE.

Here, it is assumed that an image is displayed on the display device DSP' according to the comparative example of the present embodiment. In this case, a high voltage of, for example, 40 V or above is applied to the pixel transistor SW' along with the switching drive of the pixel transistor SW'. Therefore, a strong electric field is generated in a channel region CHN' of the pixel transistor SW', and hot carriers are accelerated.

As a result, high heat due to generation of hot carriers locally occurs in the channel region CHN' (the region of the semiconductor layer SC overlapping the gate electrode GE'), and the organic insulating film (insulating film 14) formed on the pixel transistor SW' may be burned.

Such burnout of the organic insulating film affects the threshold characteristic (Vth characteristic) of the pixel transistor SW', and thus causes characteristic abnormality and operation abnormality of the pixel transistor SW'.

In the example illustrated in FIGS. 4 and 5, the drain electrode DE overlaps a part of the gate electrode GE', but it is not possible to suppress the above burnout of the organic insulating film under a high voltage applied in the EPD device just by making the drain electrode DE overlap a part of the gate electrode GE' in this manner.

Here, in order to suppress the above burnout of the organic insulating film, in the comparative example of the present embodiment, a configuration is considered in which the entire gate electrode GE' is covered (overlapped) with, for example, the drain electrode DE (drain metal).

On the other hand, in such a configuration, the electric field generated by the voltage state of the drain electrode DE may affect the channel region CHN' and change the transistor characteristics. That is, it is conceivable that the entire pixel transistor (including the source electrode SE and the drain electrode DE) has an asymmetric configuration in terms of circuit design, and transistor characteristics change (are not symmetrical) between the case where a positive voltage is applied to the source electrode SE and a negative voltage is applied to the drain electrode DE and the case where these applications are reversed. Therefore, good transistor characteristics may be impaired.

On the other hand, in the present embodiment, the pixel transistor SW has a double gate structure, and the source electrode SE covering one gate electrode GE1 (the channel region corresponding to the gate electrode GE1) in the double gate structure is formed, and the drain electrode DE covering the other gate electrode GE2 (the channel region corresponding to the gate electrode GE2) is formed.

According to this configuration, the heat generated in the channel region corresponding to the gate electrode GE1 is dispersed in the source electrode SE, and the heat generated in the channel region corresponding to the gate electrode GE2 is dispersed in the drain electrode DE.

As described above, in the present embodiment, the pixel transistor SW includes the semiconductor layer SC having the first end EP1 and the second end EP2, the gate electrode (first gate electrode) GE1 overlapping the semiconductor layer SC at a position closer to the first end EP1 of the semiconductor layer SC, the gate electrode (second gate electrode) GE2 overlapping the semiconductor layer SC between the gate electrode GE1 and the second end EP2 of the semiconductor layer SC, the source electrode SE connected to the first end EP1 of the semiconductor layer SC, and the drain electrode DE connected to the second end EP2 of the semiconductor layer SC. In the present embodiment, the gate electrodes GE1 and GE2, the source electrode SE, and the drain electrode DE are disposed in different layers.

In the present embodiment, the source electrode SE overlaps the ends GE1a and GE1b of the gate electrode GE1 in planar view. Further, the drain electrode DE overlaps the ends GE2a and GE2b of the gate electrode GE2 in planar view.

That is, in the present embodiment, the pixel transistor SW has the double gate structure, and the source electrode SE and the drain electrode DE are extended and overlapped with the gate electrodes GE1 and GE2, respectively (the intermediate node is covered with the source electrode SE and the drain electrode DE). This makes it possible to disperse (dissipate) the heat generated by the pixel transistor due to driving of the display device DSP (for example, an EPD device) under a high voltage in the source electrode SE and the drain electrode DE. According to this configuration, local heat transfer to the organic insulating film can be reduced, and burnout of the organic insulating film can be suppressed (that is, the allowable withstand voltage is improved). Therefore, abnormality caused by heat generation can be reduced.

In the present embodiment, the shapes and areas (sizes) of the gate electrodes GE1 and GE2 in planar view are the same, and the area of a part of the gate electrode GE1 overlapping the source electrode SE is the same as the area of a part of the gate electrode GE2 overlapping the drain electrode DE.

That is, in the present embodiment, by making the width of the source electrode SE overlapping the channel region (first channel region) CHN1 corresponding to the gate electrode GE1 and the width (that is, the metal width) of the drain electrode DE overlapping the channel region (second channel region) CHN2 corresponding to the gate electrode GE2 the same, the transistor characteristics (Vth, on-current) when S-D is reversed are symmetrical, and it is possible to obtain good transistor characteristics that easily secure a margin in terms of drive design.

Here, in the present embodiment, the source electrode SE may extend at least to a position where the end of the source electrode SE coincides with the end of the channel region CHN1 corresponding to the gate electrode GE1 (that is, the source electrode SE may overlap the end of the channel region CHN1 corresponding to the first end GE1$a$ and the end of the channel region CHN1 corresponding to the second end GE1$b$ of the gate electrode GE1), but the source electrode SE may extend to a position where the end of the source electrode SE exceeds the end of the channel region CHN1 corresponding to the gate electrode GE1. In other words, in the present embodiment, the source electrode SE is formed to cover at least the channel region CHN1 corresponding to the gate electrode GE1 in planar view.

Similarly, in the present embodiment, the drain electrode DE may extend at least to a position where the end of the drain electrode DE coincides with the end of the channel region CHN2 corresponding to the gate electrode GE2 (that is, the drain electrode DE may overlap the end of the channel region CHN2 corresponding to the third end GE2$a$ and the end of the channel region CHN2 corresponding to the fourth end GE2$b$ of the gate electrode GE2), but the drain electrode DE may extend to a position where the end of the drain electrode DE exceeds the end of the channel region CHN2 corresponding to the gate electrode GE2. In other words, in the present embodiment, the drain electrode DE is formed to cover at least the channel region CHN2 corresponding to the gate electrode GE2 in planar view.

In this case, in order to enhance the efficiency of heat dissipation in the above heat generation, it is preferable that the areas of the source electrode SE and the drain electrode DE are both large. As a result, it is conceivable that the end of the source electrode SE exceeding the second end GE1$b$ of the gate electrode GE1 and the end of the drain electrode DE exceeding the fourth end GE2$b$ of the gate electrode GE2 are close to each other between the gate electrodes. However, if the ends are excessively close to each other, the source electrode SE and the drain electrode DE may be electrically connected and short-circuited. Therefore, it is assumed that the end of the source electrode SE and the end of the drain electrode DE are close to each other to such an extent that a short circuit does not occur. In order to suppress a short circuit between the source electrode SE and the drain electrode DE, for example, the corner (end) of the source electrode SE on the drain electrode DE side and the corner (end) of the drain electrode DE on the source electrode SE side may be chamfered.

Figure 6:
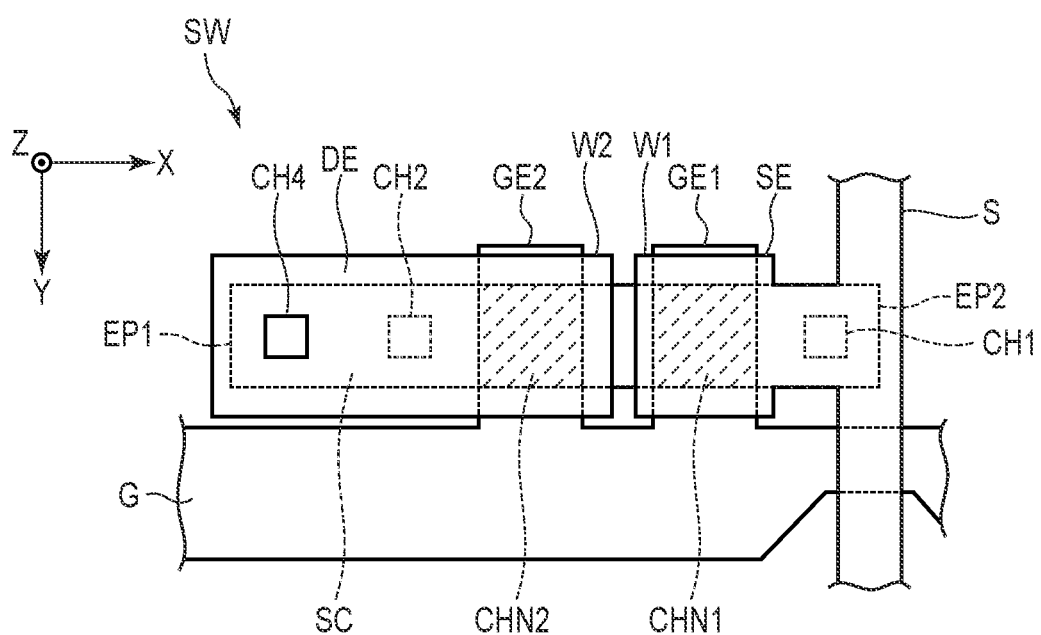
FIG. 6 is a diagram for describing an example of a configuration of a source electrode and a drain electrode.

Further, since the source electrode SE is connected (integrally formed) to the signal line S having a relatively large area, even if heat is generated in the channel region corresponding to the gate electrode GE1, the heat is easily dissipated (easily released) to the signal line S side. On the other hand, the drain electrode DE is formed in an island shape, and is less likely to release heat than the source electrode SE. Therefore, as illustrated in FIG. 6, for example, a width W1 (first width) in which the source electrode SE extends beyond the gate electrode GE1 is formed to be smaller than a width W2 (second width) in which the drain electrode DE extends beyond the gate electrode GE2.

According to such a configuration, the drain electrode DE can be formed large, and the dispersion effect against the heat generation in the channel region CHN2 corresponding to the gate electrode GE2 can be improved.

Note that, although the pixel transistor SW included in the pixel portion (display area DA) has been mainly described in the present embodiment, the present embodiment may be applied to, for example, a protection diode (protection circuit) included in the peripheral portion (non-display area NDA).

Here, an example of a configuration of the protection diode will be briefly described with reference to FIG. 7. In the present embodiment, at least one of the above protection diodes 4 and 5 illustrated in FIG. 1 may have the configuration illustrated in FIG. 7.

Specifically, the protection diodes 4 and 5 include diode-connected thin film transistors, and for example, the threshold voltages of the protection diodes 4 and 5 are made higher than those of the pixel transistor included in the pixel PX. With the protection diodes 4 and 5, the pixel transistor (pixel circuit) can be protected when a surge current enters.

Figure 7:
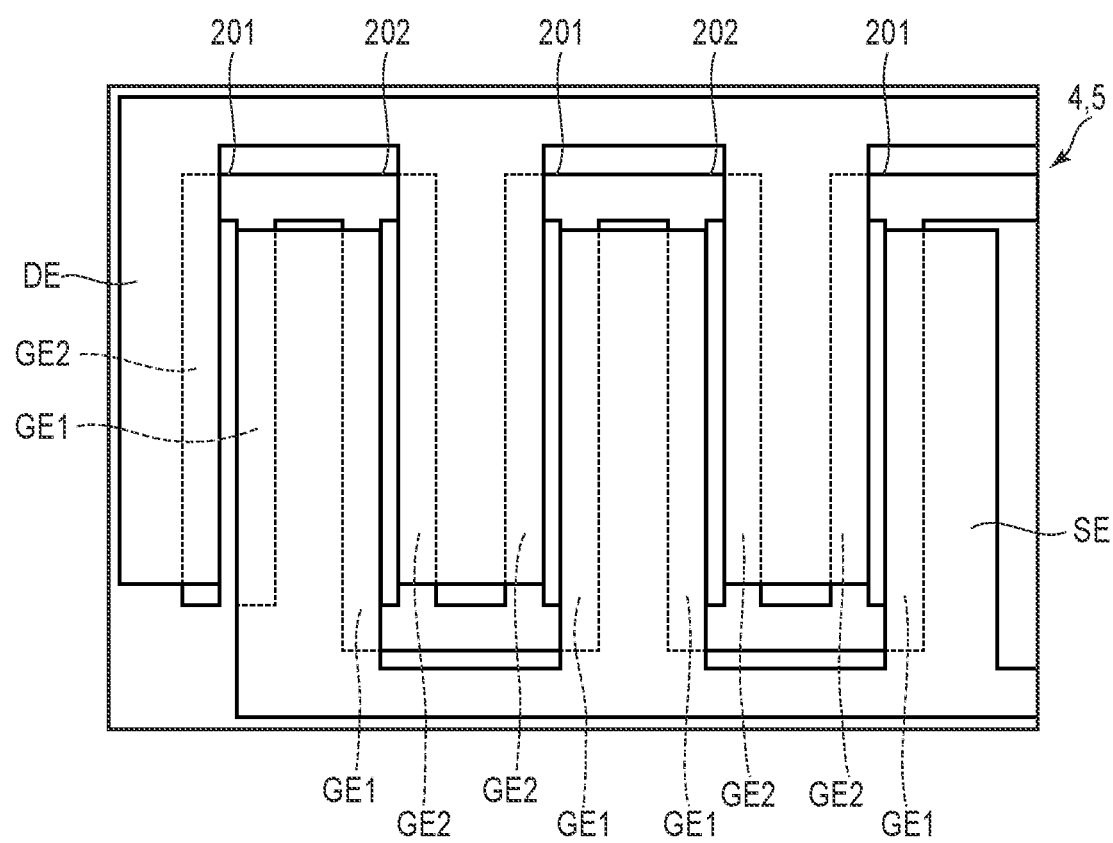
FIG. 7 is a diagram for describing an example of a configuration of a protection diode.

As illustrated in FIG. 7, in the protection diodes 4 and 5, the gate electrode has a configuration in which a gate electrode portion (first gate electrode portion) 201 where the gate electrodes GE1 and GE2 are disposed in this order and a gate electrode portion (second gate electrode portion) 202 where the gate electrodes GE2 and GE1 are disposed in this order are alternately disposed.

With respect to such gate electrodes, the source electrode SE and the drain electrode DE are formed in a comb-teeth shape, and are disposed to be engaging with each other in planar view. According to this configuration, the source electrode SE is disposed at a position overlapping the gate electrode GE1, and the drain electrode DE is disposed at a position overlapping the gate electrode GE2.

In the protection diodes 4 and 5 as illustrated in FIG. 7, similarly to the above pixel transistor SW, since the gate electrode GE1 is covered with the source electrode SE and the gate electrode GE2 is covered with the drain electrode DE, heat generated in the channel region of the transistor can be dispersed. In FIG. 7, the semiconductor layer SC is omitted.

The protection diodes 4 and 5 have been described here, but heat generated in the channel region of the transistor can be dispersed by similarly forming a double gate structure and forming a source electrode and a drain electrode overlapping each of the two gate electrodes even in other transistors included in the peripheral portion.

Figure 8:
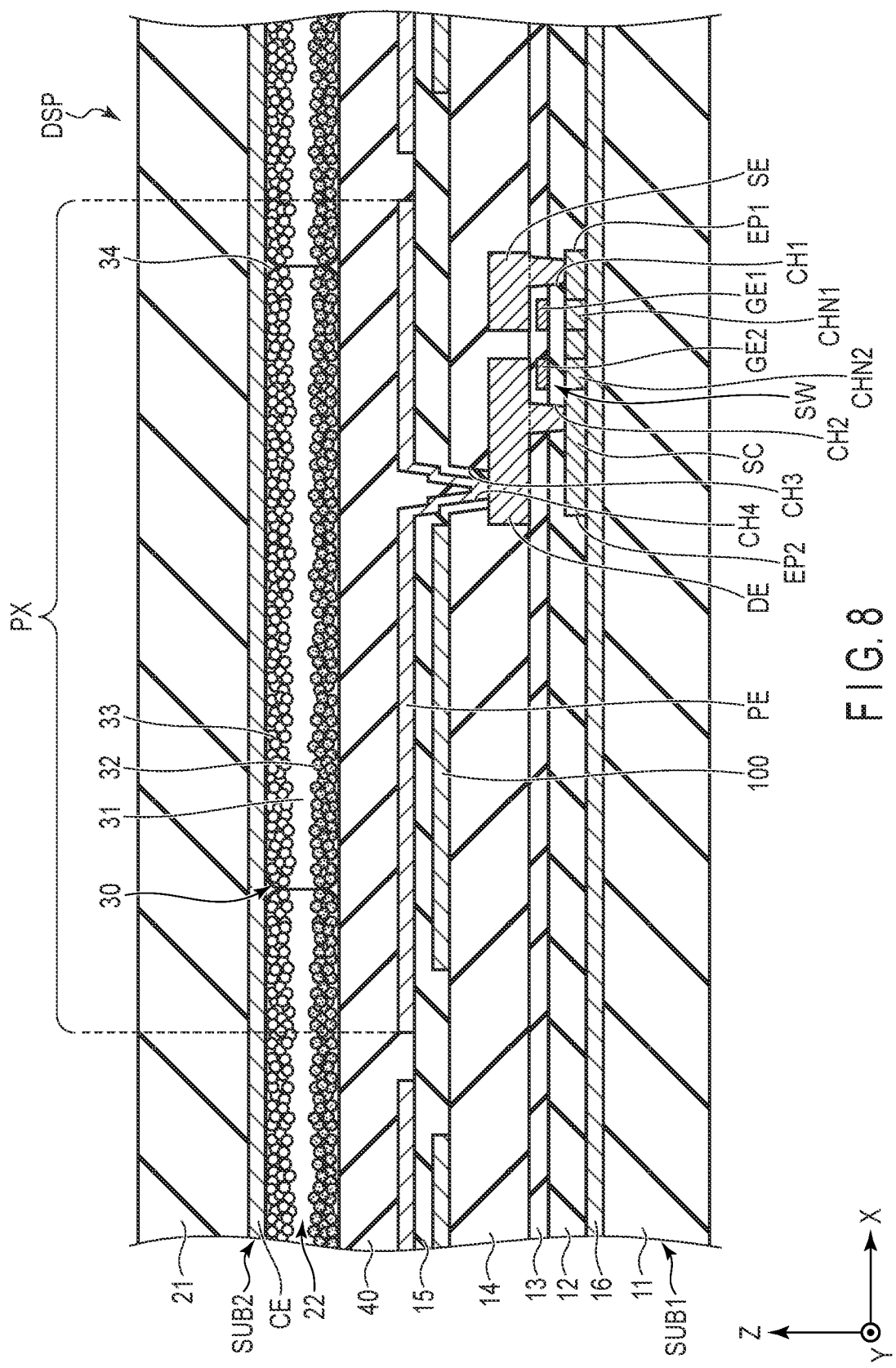
FIG. 8 is a diagram illustrating an example of a top gate type pixel transistor.

Note that, the case where the pixel transistor SW is a bottom gate type transistor has been described in the present embodiment, but the present embodiment may be applied to a top gate type transistor in which the gate electrodes GE1 and GE2 are disposed between the source electrode SE and the drain electrode DE and the semiconductor layer SC (that is, on the semiconductor layer SC), as illustrated in FIG. 8.

In the example illustrated in FIG. 8, the first substrate SUB1 includes the base material 11 and the insulating films 12 to 15 as with the case of the bottom gate type, but an undercoat layer 16 is further provided between the base material 11 and the semiconductor layer SC. The undercoat layer 16 corresponds to an inorganic insulating film formed of an inorganic material. Note that detailed description of the parts that are similar to those in FIG. 2 and the like is omitted here.

In addition, in the present embodiment, the display device DSP has been mainly described as an EPD device, but the transistor described in the present embodiment may be applied to a display device other than the EPD device (for example, a liquid crystal display device). Furthermore, the transistor described in the present embodiment may be applied to an electronic device and the like other than a display device. The same applies to the following embodiments.

Second Embodiment

Next, a second embodiment will be described. Note that the configuration of the display device according to the present embodiment is similar to that of the first embodiment described above, and thus will be appropriately described with reference to FIG. 1.

FIG. 9 is a diagram illustrating an example of a cross section of a pixel PX along a first direction X according to the present embodiment. Note that the above parts that are similar to those in FIG. 2 are denoted by the same reference numerals and characters, and a detailed description thereof will be omitted. Here, parts that are different from those in FIG. 2 will be mainly described.

In the first embodiment described above, a source electrode SE overlaps a gate electrode GE1, and a drain electrode DE overlaps a gate electrode GE2. However, the present embodiment is different from the first embodiment in that a floating metal (metal member) is disposed at a position overlapping the gate electrodes GE1 and GE2.

As illustrated in FIG. 9, a floating metal FM is located on an insulating film 13 and covered with an insulating film 14. The floating metal FM is disposed on the same layer as the source electrode SE and the drain electrode DE and at a position sandwiched between the source electrode SE and the drain electrode DE. The floating metal FM is formed using the metal materials described above.

Note that, in the example illustrated in FIG. 9, a pixel transistor SW is a bottom gate type transistor.

Figure 10:
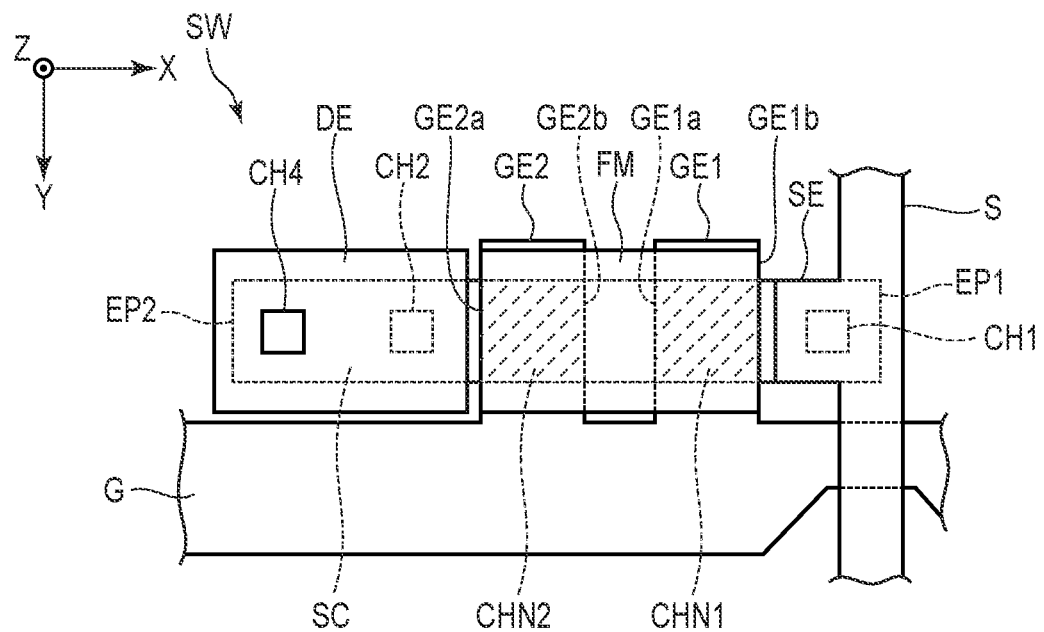
FIG. 10 is a plan view illustrating an example of a pixel transistor according to the present embodiment.

FIG. 10 is a plan view of the pixel transistor SW according to the present embodiment. Note that the above parts that are similar to those in FIG. 3 are denoted by the same reference numerals and characters, and a detailed description thereof will be omitted. Here, parts that are different from those in FIG. 3 will be mainly described.

The pixel transistor SW in the present embodiment has a double gate structure as with the first embodiment described above.

The source electrode SE is electrically connected to the semiconductor layer SC in the through hole CH1. The drain electrode DE is electrically connected to the semiconductor layer SC in the through hole CH2.

In the present embodiment, the source electrode SE does not overlap the gate electrodes GE1 and GE2 in planar view. Similarly, the drain electrode DE does not overlap the gate electrodes GE1 and GE2 in planar view.

Here, in the present embodiment, the floating metal FM is formed at a position sandwiched between the source electrode SE and the drain electrode DE as described above.

The floating metal FM overlaps all of the ends GE1a and GE1b of the gate electrode GE1 and ends GE2a and GE2b of the gate electrode GE2.

In this case, the floating metal FM extends to a position where the end of the floating metal FM on the source electrode SE side and the end GE1a of the gate electrode GE1 at least coincide with each other in planar view, and extends to a position where the end of the floating metal FM on the drain electrode DE side and the end GE2a of the gate electrode GE2 at least coincide with each other in planar view.

That is, in the present embodiment, the floating metal FM that entirely covers the gate electrodes GE1 and GE2 (the upper portions of channel regions CHN1 and CHN2 corresponding to the gate electrodes GE1 and GE2, respectively) in the first direction X is formed.

In the example illustrated in FIG. 10, both ends of the floating metal FM in the first direction X coincide with the end GE1a of the gate electrode GE1 and the end GE2a of the gate electrode GE2 in planar view, but the floating metal FM may cover the gate electrodes GE1 and GE2. Therefore, both ends of the floating metal FM may further extend to both the source electrode SE side and the drain electrode DE side, or may further extend to just one of the source electrode SE side and the drain electrode DE side.

As described above, in the present embodiment, the pixel transistor SW has the double gate structure, and the floating metal FM (metal member) is disposed at a position overlapping the gate electrode GE1 (the channel region CHN1 corresponding to the gate electrode GE1) and the gate electrode GE2 (the channel region CHN2 corresponding to the gate electrode GE2).

According to this configuration, the heat generated in the channel region CHN1 corresponding to the gate electrode GE1 and the heat generated in the channel region CHN2 corresponding to the gate electrode GE2 are dispersed in the floating metal FM.

Therefore, in the present embodiment, heat transfer to the organic insulating film can be reduced, and burnout of the organic insulating film can be suppressed. Therefore, abnormality caused by heat generation can be reduced.

In the example illustrated in FIG. 10, the width of the floating metal FM in a second direction Y in planar view is narrower than the widths of the gate electrodes GE1 and GE2 in the second direction Y. However, the width of the floating metal FM in the second direction Y may further extend in the second direction Y. According to this configuration, since the area of the floating metal FM can be increased and the gate electrodes GE1 and GE2 can be covered for sure, it is possible to further improve the above dispersion effect against the heat generation in the channel region of the pixel transistor SW.

Figure 11:
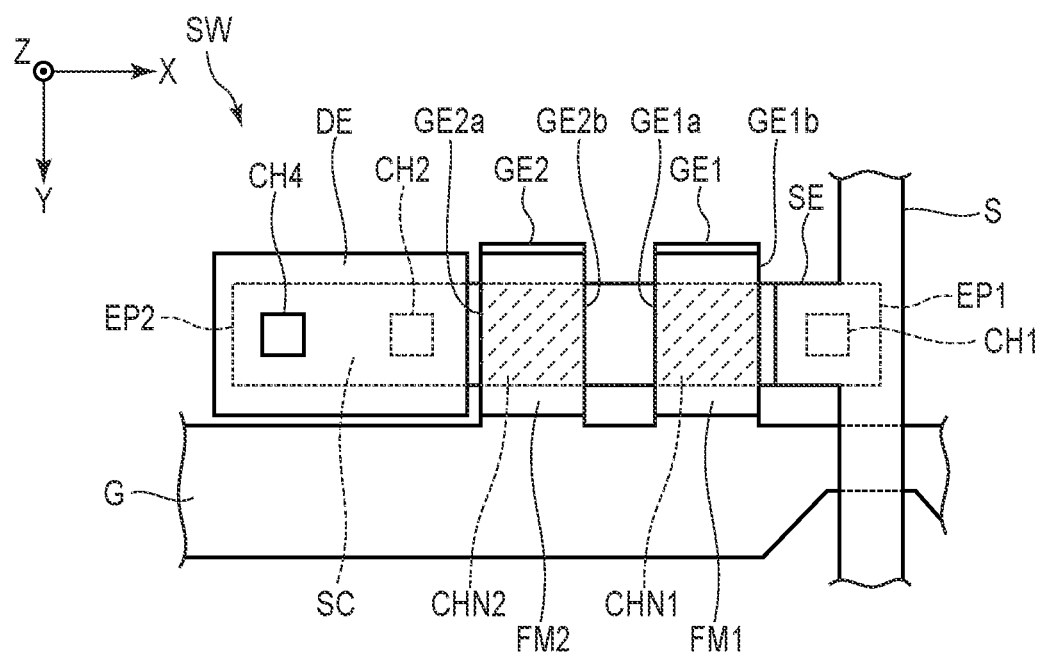
FIG. 11 is a plan view illustrating another example of the pixel transistor according to the present embodiment.

In addition, in FIG. 10, it has been described that one floating metal FM overlapping the gate electrode GE1 (the channel region CHN1 corresponding to the gate electrode GE1) and the gate electrode GE2 (the channel region CHN2 corresponding to the gate electrode GE2) is formed, but as illustrated in FIG. 11, a first floating metal FM1 overlapping the gate electrode GE1 and a second floating metal FM2 overlapping the gate electrode GE2 may be formed.

Even in the configuration in which the first floating metal FM1 and the second floating metal FM2 illustrated in FIG. 11 are formed, the heat generated in the channel region CHN1 corresponding to the gate electrode GE1 can be dispersed in the first floating metal FM1, and the heat generated in the channel region CHN2 corresponding to the gate electrode GE2 can be dispersed in the second floating metal FM2. Therefore, abnormality caused by heat generation can be reduced.

Note that, although the pixel transistor SW included in a pixel portion has been mainly described in the present embodiment, the present embodiment may be applied to a transistor included in a peripheral portion as described in the first embodiment.

Figure 12:
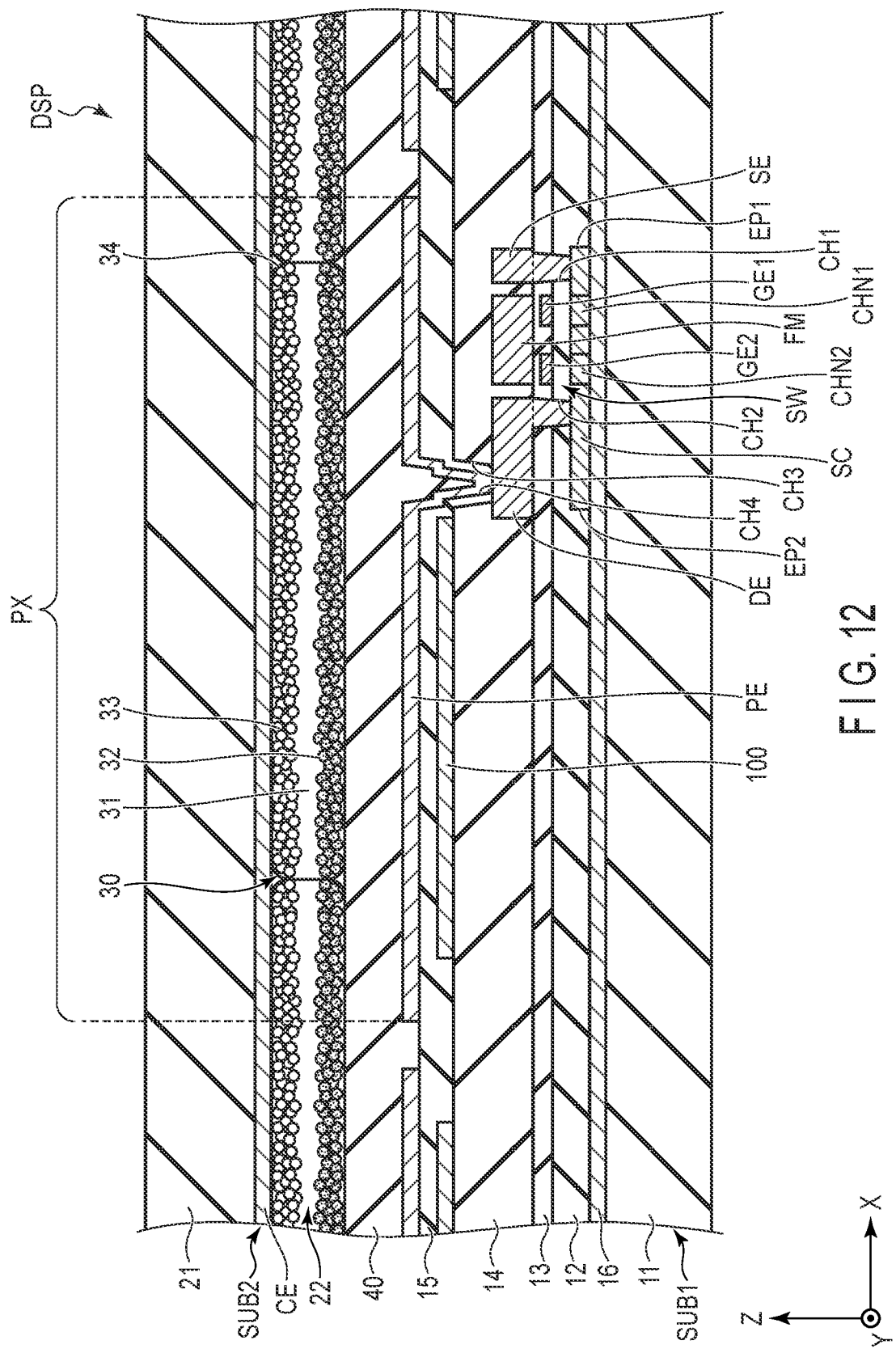
FIG. 12 is a diagram illustrating an example of a top gate type pixel transistor.

Furthermore, in the present embodiment, the case in which the pixel transistor SW is a bottom gate type transistor has been described, but the present embodiment may be applied to a top gate type transistor as illustrated in FIG. 12. Note that the configuration is similar to that of FIG. 8 described above except that the floating metal FM is disposed between the source electrode SE and the drain electrode DE, and thus, a detailed description thereof will be omitted here.

Third Embodiment

Next, a third embodiment will be described. Note that the configuration of the display device according to the present embodiment is similar to that of the first embodiment described above, and thus will be appropriately described with reference to FIG. 1 and the like.

In the first embodiment described above, an example of a protection diode included in a peripheral portion (non-display area NDA) has been described, but in the present embodiment, another example of the protection diode will be described.

Figure 13:
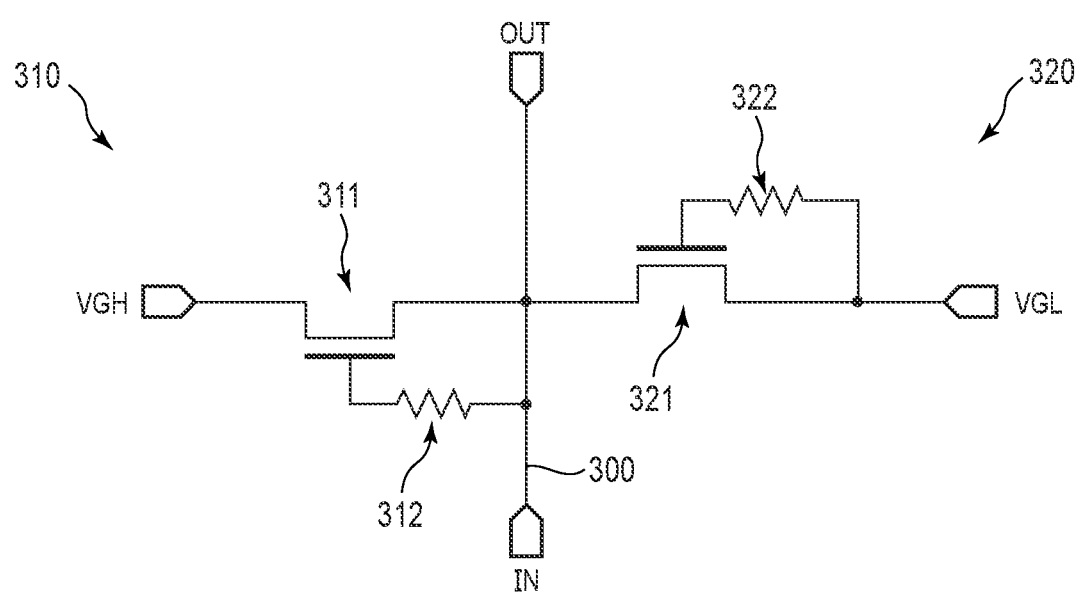
FIG. 13 is an example of a circuit diagram of a protection diode used in a display device according to a third embodiment.

FIG. 13 illustrates an example of a circuit diagram of a protection diode used in a display device according to the present embodiment. The protection diode in the present embodiment is a protection circuit for protecting a circuit electrically connected to a signal wiring 300 from a surge current flowing through the signal wiring 300 by, for example, occurrence of electrostatic discharge (ESD). The protection diode has a structure including two diode-connected transistors.

As illustrated in FIG. 13, the protection diode includes a first rectifier element 310 including a diode-connected first transistor 311 and a first resistance element 312, and a second rectifier element 320 including a diode-connected second transistor 321 and a second resistance element 322. Note that the first transistor 311 and the second transistor 321 are, for example, bottom gate type transistors in which the gate electrode is disposed below the semiconductor layer, but may be top gate type transistors.

The first transistor 311 has a source electrode and a drain electrode as a pair of terminal electrodes, and one terminal electrode of the pair of terminal electrodes is connected to the signal wiring 300, and the other terminal electrode of the first transistor 311 is connected to a power supply line (hereinafter, referred to as a power supply line VGH) to which a power supply voltage VGH is applied. In addition, the first resistance element 312 is disposed between the signal wiring 300 and the gate electrode of the first transistor 311. In addition, the gate electrode of the first transistor 311 is connected to the signal wiring 300 via the first resistance element 312. Thus, the gate electrode is diode-connected to the other terminal electrode.

The second transistor 321 has a source electrode and a drain electrode as a pair of terminal electrodes, and one terminal electrode of the pair of terminal electrodes is connected to a power supply line (hereinafter, referred to as a power supply line VGL) to which a power supply voltage VGL is applied, and the other terminal electrode of the second transistor 321 is connected to the signal wiring 300. In addition, the second resistance element 322 is disposed between the gate electrode of second transistor 321 and the power supply line VGL. In addition, the gate electrode is connected to the power supply line VGL via the second resistance element 322. Thus, the gate electrode is diode-connected to one terminal electrode.

According to such a protection diode, for example, when a voltage higher than the power supply voltage VGH is applied to the signal wiring 300, the first transistor 311 is conducted, and a current based on the voltage can flow to the power supply line VGH side. On the other hand, for example, when a voltage lower than the power supply voltage VGL is applied to the signal wiring 300, the second transistor 321 is conducted, and a current based on the voltage can flow to the power supply line VGL side. As a result, it is possible to suppress the surge current flow from the IN terminal side toward the OUT terminal side of the signal wiring 300.

Figure 14:
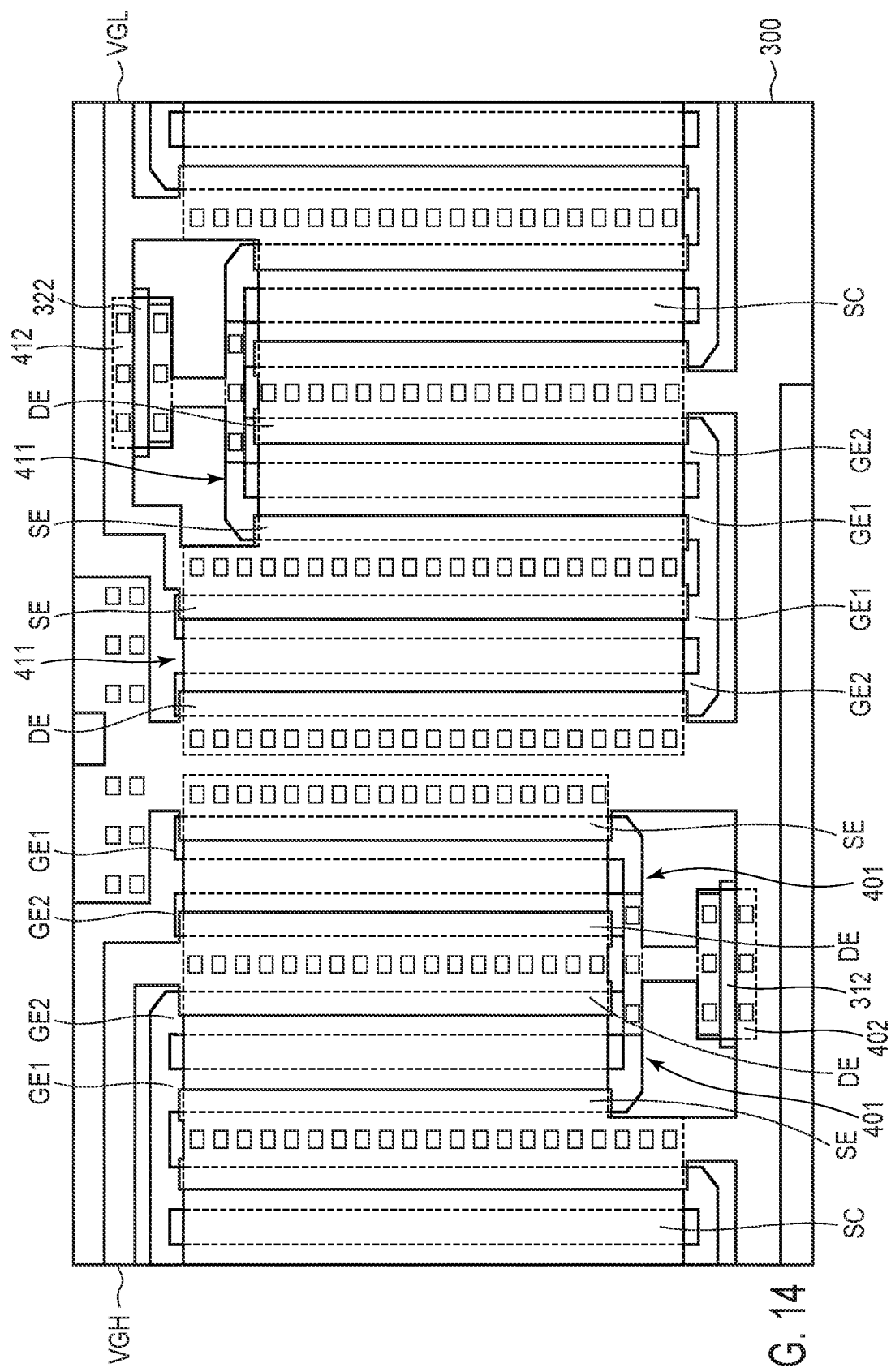
FIG. 14 is an example of a plan view of the protection diode.

FIG. 14 is a plan view of the above protection diode. The first rectifier element 310 is formed by connecting the plurality of first transistors 311 having a double gate structure to each other. In addition, in the gate electrodes of the plurality of first transistors 311, a plurality of gate electrode portions 401 including two gate electrodes GE1 and GE2 are arranged side by side. The channel width of each of the first transistors 311 are the same or substantially the same. More specifically, in the plurality of first transistors 311, a portion where the gate electrodes GE1 and GE2 are disposed in this order and a portion where the gate electrodes GE2 and GE1 are disposed side by side are alternately disposed and connected to each other. The gate electrode of the first transistor 311 is connected to the signal wiring 300 via a diode connection portion 402 including a semiconductor layer functioning as the first resistance element 312.

In addition, the signal wiring 300 also serves as the other terminal electrode of the first transistor 311, and is connected to a semiconductor layer SC via through holes. In addition, the signal wiring 300 overlaps the gate electrode GE1 via the semiconductor layer SC in planar view. More specifically, the signal wiring 300 is provided to cover the end edge closer to the signal wiring 300 among the end edges of the gate electrode. Thus, a part of the channel region (region closer to the signal wiring 300) where the gate electrode overlaps the semiconductor layer SC is covered with the signal wiring 300. In addition, the power supply line VGH also serves as one terminal electrode of the first transistor 311, and is connected to the semiconductor layer SC via a through hole. In addition, the power supply line VGH overlaps the gate electrode GE2 of the gate electrode 401 via the semiconductor layer SC in planar view. More specifically, the power supply line VGH is provided to cover the end edge closer to the power supply line VGH among the end edges of the gate electrode. Thus, a part of the channel region (region closer to the power supply line VGH) formed by the gate electrode overlapping the semiconductor layer SC is covered with the power supply line VGH.

Here, the first transistor 311 has been described here, but the second transistor 321 has a similar configuration. Specifically, the second rectifier element 320 is formed by connecting the plurality of second transistors 321 having a double gate structure to each other. In addition, in the gate electrodes of the plurality of second transistors 321, a plurality of gate electrode portions 411 including two gate electrodes GE1 and GE2 are arranged side by side, and the channel width of each of the second transistors 321 are the same or substantially the same. More specifically, in the plurality of second transistors 321, a portion where the gate electrodes GE1 and GE2 are disposed in this order and a portion where the gate electrodes GE2 and GE1 are disposed side by side are alternately disposed and connected to each other. The gate electrode of the second transistor 321 is connected to the power supply line VGL via a diode connection portion 412 including the second resistance element 322.

In addition, the power supply line VGL also serves as one terminal electrode of the second transistor 321, and is connected to the semiconductor layer SC via through holes. In addition, the power supply line VGL overlaps the gate electrode GE1 via the semiconductor layer SC in planar view. More specifically, the power supply line VGL is provided to cover the end edge closer to the power supply line VGL among the end edges of the gate electrode. Thus, a part of the channel region (region closer to the power supply line VGL) formed by the gate electrode overlapping the semiconductor layer SC is covered with power supply line VGL. In addition, the signal wiring 300 also serves as the other terminal electrode of the second transistor 321, and is connected to the semiconductor layer SC via a through hole. In addition, the signal wiring 300 overlaps the gate electrode GE2 of the gate electrode 411 via the semiconductor layer SC in planar view. More specifically, the signal wiring 300 is provided to cover the end edge closer to the signal wiring 300 among the end edges of the gate electrode. Thus, a part of the channel region (region closer to the signal wiring 300) formed by the gate electrode overlapping the semiconductor layer SC is covered with the signal wiring 300.

As described above, in the present embodiment, the transistor included in the protection diode has a configuration in which the gate electrode portion (first gate electrode portion) where gate electrodes GE1 and GE2 are disposed in this order and the gate electrode portion (second gate electrode portion) where gate electrodes GE2 and GE1 are disposed in this order are alternately disposed, and the terminal electrode connected to the signal wiring 300 or the power supply line (the power supply lines VGH and VGL) is disposed at a position overlapping at least a part of the gate electrodes GE1 and GE2. In the present embodiment, the terminal electrode of each transistor is provided in a state of covering a part of the gate electrode, more specifically, the end edge of the gate electrode closer to the terminal electrode. On the other hand, it is also possible to adopt a configuration in which these terminal electrodes cover not just the close end edge but also the far end edge of the gate electrode, that is, a configuration in which these terminal electrodes cover the entire channel region.

With the above configuration, the protection diode according to the present embodiment can disperse heat generated in the channel region of the transistor in the terminal electrode covering the gate electrode GE1.

According to at least one of the embodiments described above, it is an object to provide a display device and a transistor capable of reducing abnormality caused by heat generation in the channel region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display panel comprising a pixel portion where a plurality of pixels is disposed and a peripheral portion provided around the pixel portion; and
a drive circuit that is provided in the peripheral portion and is configured to drive the pixel, wherein
a transistor is provided in the pixel portion or the peripheral portion, the transistor comprises a semiconductor layer having a first end and a second end, a first gate electrode overlapping the semiconductor layer at a position closer to the first end, a second gate electrode overlapping the semiconductor layer between the first gate electrode and the second end, a source electrode connected to the first end, and a drain electrode connected to the second end,
the first and second gate electrodes are disposed in a first layer,
the source electrode and the drain electrode are disposed in a second layer different from the first layer,
the source electrode is formed to cover at least a first channel region that is an overlapping region of the first gate electrode and the semiconductor layer in planar view,
the drain electrode is formed to cover at least a second channel region that is an overlapping region of the second gate electrode and the semiconductor layer in planar view,
an insulating film consisting of a single layer is disposed between the semiconductor layer and the second layer, and
the source electrode is formed to cover a whole of the first channel region.

2. The display device according to claim 1, wherein
a shape and an area of the first channel region and the second channel region in planar view are the same, and
an area of a part of the first channel region overlapping the source electrode is the same as an area of a part of the second channel region overlapping the drain electrode.

3. The display device according to claim 1, wherein
the peripheral portion includes a protection circuit,
the protection circuit is configured so that a first gate electrode portion where the first gate electrode and the second gate electrode are disposed side by side in this order and a second gate electrode portion where the second gate electrode and the first gate electrode are disposed side by side in this order are alternately disposed, and
the source electrode and the drain electrode are formed in a comb-teeth shape engaging with each other in a manner that the source electrode is disposed at a position overlapping the first gate electrode and the drain electrode is disposed at a position overlapping the second gate electrode.

4. The display device according to claim 1, wherein
the peripheral portion includes a signal wiring, a power supply line, and a protection circuit provided between the signal wiring and the power supply line, the transistor is included in the protection circuit, and
one of the source electrode and the drain electrode of the transistor is connected to the signal wiring, the other is connected to the power supply line, and the first and second gate electrodes are connected to one of the source electrode and the drain electrode.

5. The display device according to claim 1, wherein
the source electrode has a first extension portion over the first channel region, the drain electrode has a second extension portion over the second channel region, and a first length of the first extension portion is smaller than a second length of the second extension portion.

6. The display device according to claim 1, wherein the transistor is a bottom gate type transistor in which the first and second gate electrodes are disposed between a base material and the semiconductor layer.

7. The display device according to claim 1, wherein the transistor is a top gate type transistor in which the first and second gate electrodes are disposed between the semiconductor layer and the source electrode and the drain electrode.

8. The display device according to claim 1, wherein the drain electrode is formed to cover a whole of the second channel region.

9. A transistor comprising:
a semiconductor layer having a first end and a second end;
a first gate electrode overlapping the semiconductor layer at a position closer to the first end;
a second gate electrode overlapping the semiconductor layer at a position closer to the second end;
a source electrode connected to the first end; and
a drain electrode connected to the second end, wherein
the first and second gate electrodes are disposed in a first layer,
the source electrode and the drain electrode are disposed in a second layer different from the first layer,
the source electrode is formed to cover at least a first channel region that is an overlapping region of the first gate electrode and the semiconductor layer in planar view,
the drain electrode is formed to cover at least a second channel region that is an overlapping region of the second gate electrode and the semiconductor layer in planar view, and
an insulating film consisting of a single layer is disposed between the semiconductor layer and the second layer, and
the source electrode is formed to cover a whole of the first channel region.

10. The transistor according to claim 9, wherein the drain electrode is formed to cover a whole of the second channel region.

11. A display device comprising:
a display panel comprising a pixel portion where a plurality of pixels are disposed and a peripheral portion provided around the pixel portion; and
a drive circuit that is provided in the peripheral portion and is configured to drive the pixels, wherein
a transistor is provided in the pixel portion or the peripheral portion, the transistor comprises a semiconductor layer having a first end and a second end, a first gate electrode overlapping the semiconductor layer at a position closer to the first end, a second gate electrode overlapping the semiconductor layer between the first gate electrode and the second end, a source electrode connected to the first end, and a drain electrode connected to the second end,
the first and second gate electrodes are disposed in a first layer,
the source electrode and the drain electrode are disposed in a second layer different from the first layer,
the source electrode is formed to cover at least a first channel region that is an overlapping region of the first gate electrode and the semiconductor layer in planar view,
the drain electrode is formed to cover at least a second channel region that is an overlapping region of the second gate electrode and the semiconductor layer in planar view,
an insulating film consisting of a single layer is disposed between the semiconductor layer and the second layer, and
the drain electrode is formed to cover a whole of the second channel region.

12. The display device according to claim 11, wherein a shape and an area of the first channel region and the second channel region in planar view are the same, and an area of a part of the first channel region overlapping the source electrode is the same as an area of a part of the second channel region overlapping the drain electrode.

13. The display device according to claim 11, wherein the peripheral portion includes a protection circuit, the protection circuit is configured so that a first gate electrode portion where the first gate electrode and the second gate electrode are disposed side by side in this order and a second gate electrode portion where the second gate electrode and the first gate electrode are disposed side by side in this order are alternately disposed, and
the source electrode and the drain electrode are formed in a comb-teeth shape engaging with each other in a manner that the source electrode is disposed at a position overlapping the first gate electrode and the drain electrode is disposed at a position overlapping the second gate electrode.

14. The display device according to claim 11, wherein the peripheral portion includes a signal wiring, a power supply line, and a protection circuit provided between the signal wiring and the power supply line, the transistor is included in the protection circuit, and
one of the source electrode and the drain electrode of the transistor is connected to the signal wiring, the other is connected to the power supply line, and the first and second gate electrodes are connected to one of the source electrode and the drain electrode.

15. The display device according to claim 11, wherein the source electrode has a first extension portion over the first channel region, the drain electrode has a second extension portion over the second channel region, and a first length of the first extension portion is smaller than a second length of the second extension portion.

16. The display device according to claim 11, wherein the transistor is a bottom gate type transistor in which the first and second gate electrodes are disposed between a base material and the semiconductor layer.

17. The display device according to claim 11, wherein the transistor is a top gate type transistor in which the first and second gate electrodes are disposed between the semiconductor layer and the source electrode and the drain electrode.

18. A transistor comprising:
a semiconductor layer having a first end and a second end;
a first gate electrode overlapping the semiconductor layer at a position closer to the first end;
a second gate electrode overlapping the semiconductor layer at a position closer to the second end;
a source electrode connected to the first end; and
a drain electrode connected to the second end, wherein
the first and second gate electrodes are disposed in a first layer,
the source electrode and the drain electrode are disposed in a second layer different from the first layer, the source electrode is formed to cover at least a first channel region that is an overlapping region of the first gate electrode and the semiconductor layer in planar view, the drain electrode is formed to cover at least a second channel region that is an overlapping region of the second gate electrode and the semiconductor layer in planar view, an insulating film consisting of a single layer is disposed between the semiconductor layer and the second layer, and the drain electrode is formed to cover a whole of the second channel region.

* * * * *